(12) United States Patent
Liaw

(10) Patent No.: US 8,405,216 B2
(45) Date of Patent: Mar. 26, 2013

(54) INTERCONNECT STRUCTURE FOR INTEGRATED CIRCUITS

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 302 days.

(21) Appl. No.: 11/170,369

(22) Filed: Jun. 29, 2005

(65) Prior Publication Data
US 2007/0001304 A1    Jan. 4, 2007

(51) Int. Cl.
*H01L 23/48* (2006.01)
*H01L 23/52* (2006.01)
*H01L 29/40* (2006.01)

(52) U.S. Cl. .................. 257/758; 257/E27.089
(58) Field of Classification Search .................. 257/758, 257/295, E27.098, E27.089
See application file for complete search history.

(56) References Cited

U.S. PATENT DOCUMENTS

| | | | | |
|---|---|---|---|---|
| 5,378,927 A * | 1/1995 | McAllister et al. | ........... | 257/773 |
| 5,930,163 A * | 7/1999 | Hara et al. | ........... | 365/154 |
| 5,986,299 A * | 11/1999 | Nakamura et al. | ........... | 257/296 |
| 6,080,664 A * | 6/2000 | Huang et al. | ........... | 438/638 |
| 6,121,129 A * | 9/2000 | Greco et al. | ........... | 438/622 |
| 6,127,260 A * | 10/2000 | Huang | ........... | 438/629 |
| 6,153,510 A * | 11/2000 | Ishibashi | ........... | 438/622 |
| 6,177,307 B1 * | 1/2001 | Tu et al. | ........... | 438/241 |
| 6,274,409 B1 * | 8/2001 | Choi | ........... | 438/128 |
| 6,277,761 B1 * | 8/2001 | Diewald et al. | ........... | 438/710 |
| 6,303,478 B1 * | 10/2001 | Nakamura et al. | ........... | 438/570 |
| 6,404,023 B1 * | 6/2002 | Mori et al. | ........... | 257/393 |
| 6,649,517 B2 * | 11/2003 | Teh et al. | ........... | 438/640 |
| 6,677,649 B2 * | 1/2004 | Osada et al. | ........... | 257/379 |
| 6,737,685 B2 * | 5/2004 | Aipperspach et al. | ........ | 257/208 |
| 6,750,555 B2 * | 6/2004 | Satomi et al. | ........... | 365/154 |
| 6,882,576 B2 * | 4/2005 | Tomita | ........... | 365/188 |
| 6,992,356 B2 * | 1/2006 | Taniguchi et al. | ........... | 257/355 |
| 7,005,694 B2 * | 2/2006 | Amo et al. | ........... | 257/296 |
| 7,087,493 B1 * | 8/2006 | Madan | ........... | 438/284 |
| 7,242,094 B2 * | 7/2007 | Matsunaga et al. | ........... | 257/758 |
| 7,319,065 B1 * | 1/2008 | Yu et al. | ........... | 438/622 |
| 7,378,342 B2 * | 5/2008 | Kirby et al. | ........... | 438/638 |
| 2002/0173096 A1 * | 11/2002 | Okudaira | ........... | 438/253 |
| 2002/0192901 A1 * | 12/2002 | Kimura et al. | ........... | 438/253 |
| 2003/0006441 A1 * | 1/2003 | Nakamura et al. | ........... | 257/296 |
| 2003/0006444 A1 * | 1/2003 | Amo et al. | ........... | 257/296 |
| 2003/0029636 A1 * | 2/2003 | Carpenter et al. | ........... | 174/260 |
| 2003/0030084 A1 * | 2/2003 | Moise et al. | ........... | 257/295 |
| 2003/0139027 A1 * | 7/2003 | Ikeda et al. | ........... | 438/592 |
| 2004/0004257 A1 * | 1/2004 | Lee et al. | ........... | 257/390 |
| 2004/0005755 A1 * | 1/2004 | Moniwa et al. | ........... | 438/222 |
| 2004/0032764 A1 * | 2/2004 | Koga et al. | ........... | 365/189.05 |
| 2004/0043550 A1 * | 3/2004 | Chakihara et al. | ........... | 438/199 |
| 2004/0065960 A1 * | 4/2004 | Egitto et al. | ........... | 257/774 |
| 2004/0079978 A1 * | 4/2004 | Kang et al. | ........... | 257/300 |
| 2004/0101663 A1 * | 5/2004 | Agarwala et al. | ........... | 428/209 |
| 2004/0164360 A1 * | 8/2004 | Nishida et al. | ........... | 257/393 |

(Continued)

*Primary Examiner* — Robert J Hoffberg
*Assistant Examiner* — Igwe U Anya
(74) *Attorney, Agent, or Firm* — Haynes and Boone, LLP

(57) ABSTRACT

The present invention discloses an interconnect structure for an integrated circuit formed on a semiconductor substrate. In one embodiment, the first conductive layer is formed above the semiconductor substrate. A first via contact is formed on the first conductive layer. A second via contact is formed on the first via contact. A second conductive layer is formed on the second via contact. One of the first and second via contacts has a cross-sectional area substantially larger that of another for improving a landing margin thereof, thereby eliminating a need of using a landing pad between the first and second via contacts.

5 Claims, 7 Drawing Sheets

U.S. PATENT DOCUMENTS

| | | | |
|---|---|---|---|
| 2004/0207043 A1* | 10/2004 | Matsunaga et al. | 257/534 |
| 2004/0245643 A1* | 12/2004 | Takewaki et al. | 257/758 |
| 2004/0259306 A1* | 12/2004 | Sakai et al. | 438/241 |
| 2005/0059236 A1* | 3/2005 | Nishida et al. | 438/655 |
| 2006/0046471 A1* | 3/2006 | Kirby et al. | 438/638 |
| 2006/0289202 A1* | 12/2006 | Takeuchi et al. | 174/262 |

* cited by examiner

US 8,405,216 B2

INTERCONNECT STRUCTURE FOR INTEGRATED CIRCUITS

BACKGROUND

The present invention relates generally to semiconductor designs, and more particularly to an interconnect structure for integrated circuits (ICs).

As the semiconductor technology advances into the deep sub-micron realm, structures on an IC chip become ever more crowded. Static random access memory (SRAM) cells, for instance, have become so dense that delivering all the necessary electrical wiring to them becomes increasingly difficult. The contacts from one metal level to another require interconnect structures. In dual damascene metallization processes, a conductive material is filled into etched vias and trenches and its excess is polished off by technology, such as chemical-mechanical-polishing (CMP). The contacts, which are formed by vias filled with conductive materials, provide vertical connection, while trenches, which are also filled with conductive materials, provide lateral pads and lines. The vias are typically the smallest features among the semiconductor structures of an IC that must be resolved by lithography and etching.

The ever-shrinking via contacts pose a great challenge to IC manufacturing due to the limited resolution of the photolithography technology. If a misalignment of vias happens, the whole interconnect structure may fail. Thus, as ICs continue to shrink in size, it is of paramount importance to provide an interconnect structure that has a proper alignment margin for the vias.

SUMMARY

The present invention discloses an interconnect structure for an integrated circuit formed on a semiconductor substrate. In one embodiment, the first conductive layer is formed above the semiconductor substrate. A first via contact is formed on the first conductive layer. A second via contact is formed on the first via contact. A second conductive layer is formed on the second via contact. One of the first and second via contacts has a cross-sectional area substantially larger than that of another for improving a landing margin thereof, thereby eliminating a need of using a landing pad between the first and second via contacts.

The construction and method of operation of the invention, however, together with additional objects and advantages thereof will be best understood from the following description of specific embodiments when read in connection with the accompanying drawings.

DESCRIPTION

Figure 1:
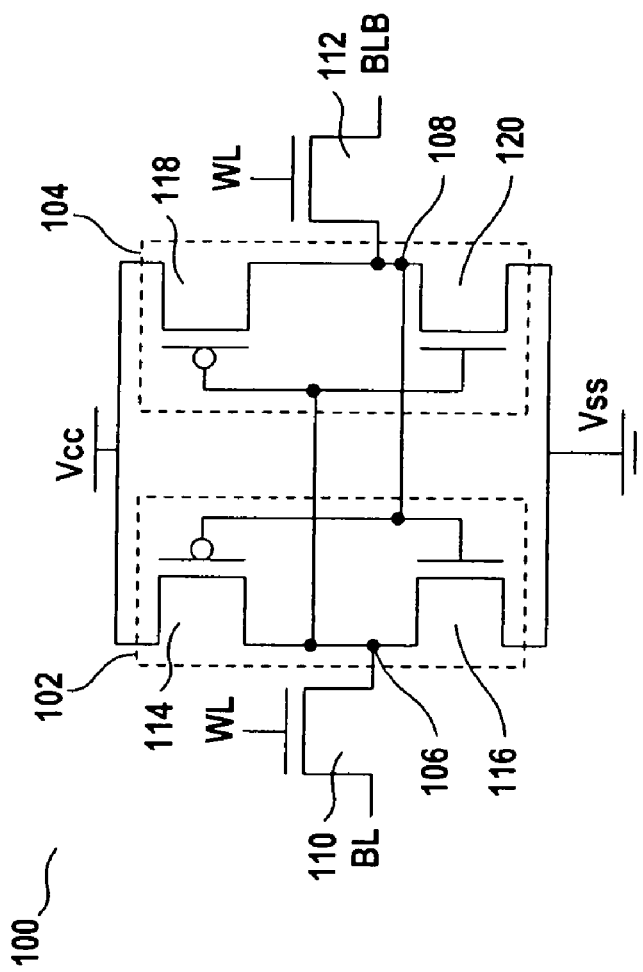
FIG. 1 is a circuit diagram of a standard six-transistor SRAM cell.

FIG. 1 is a circuit diagram 100 of a standard six-transistor SRAM cell with two cross-coupled inverters 102 and 104. The inverter 102 includes a pull-up transistor 114 and a pull-down transistor 116. The inverter 104 includes a pull-up transistor 118 and a pull-down transistor 120. A central storage node 106 of the inverter 102 is directly connected to the gates of both transistors of the inverter 104. A central storage node 108 of the inverter 104 is directly connected to the gates of both transistors of the inverter 102. The central storage node 106 of the inverter 102 is written to and read from through a transfer transistor 110 that is coupled to a bit line BL. The central storage node 108 of the inverter 104 is written to and read from through the transfer transistor 112 that is coupled to a bit line bar BLB. The two transfer transistors 110 and 112 are controlled by a common word line WL. The SRAM cell is used as a context to explain various embodiments of the present invention.

Figure 2:
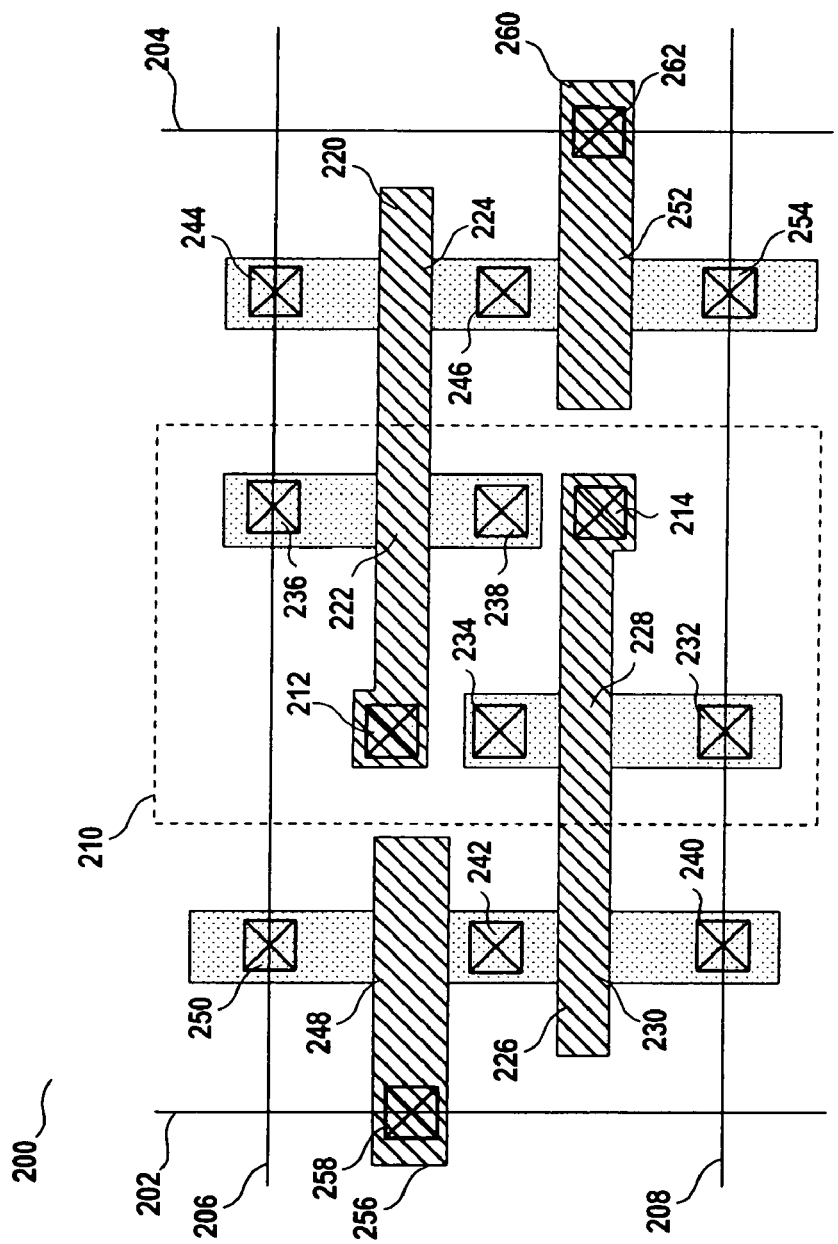
FIG. 2 is an IC layout of a unit memory cell, ready for the first metal level deposition, in accordance with one embodiment of the present invention.

FIG. 2 is an IC layout 200 of a unit memory cell, ready for a first metal level deposition, in accordance with one embodiment of the present invention. The boundary of the unit memory cell is defined by lines 202, 204, 206, and 208. Inside a window 210, P+ implant dopes all contacts, while, outside the window 210, N+ implant dopes all contacts. As shown, contacts 236, 238, 232, and 234 are doped with P+ impurities. Also shown, polycrystalline silicon (poly) lines 220 and 226 have contacts 212 and 214 that are doped with P+ impurities. All other active and poly contacts are doped with N+ impurities. The contact 212 applies to a poly gate 220 of the inverter that controls a pull-up transistor 222 and a pull-down transistor 224. The contact 214 applies to a poly gate 226 of the inverter that controls a pull-up transistor 228 and a pull-down transistor 230.

With reference to both FIGS. 1 and 2, the transistor 228 is a P-channel metal-oxide-semiconductor (MOS) transistor that has contacts 232 and 234. The transistor 222 is a PMOS transistor that has contacts 236 and 238. The transistor 230 is an NMOS transistor that has contacts 240 and 242. The transistor 224 is an NMOS transistor that has contacts 244 and 246. A pass-gate transistor 248 is an NMOS transistor that has a source contact 250 that is connected to a bit line BL, and the drain contact 242 that is common to the drain contact of the transistor 230 as part of the storage node 106. A transistor 252 is an NMOS transistor that has a source contact 254 that is connected to a bit line bar BLB, and the drain contact 246 that is common to the drain contact of the transistor 224 as part of the storage node 108. A poly gate 256 that controls the transistor 248 has a contact 258 that is connected to a word line WL. A poly gate 260 that controls the transistor 252 has a contact 262 that is connected to the word line WL.

Figure 3:
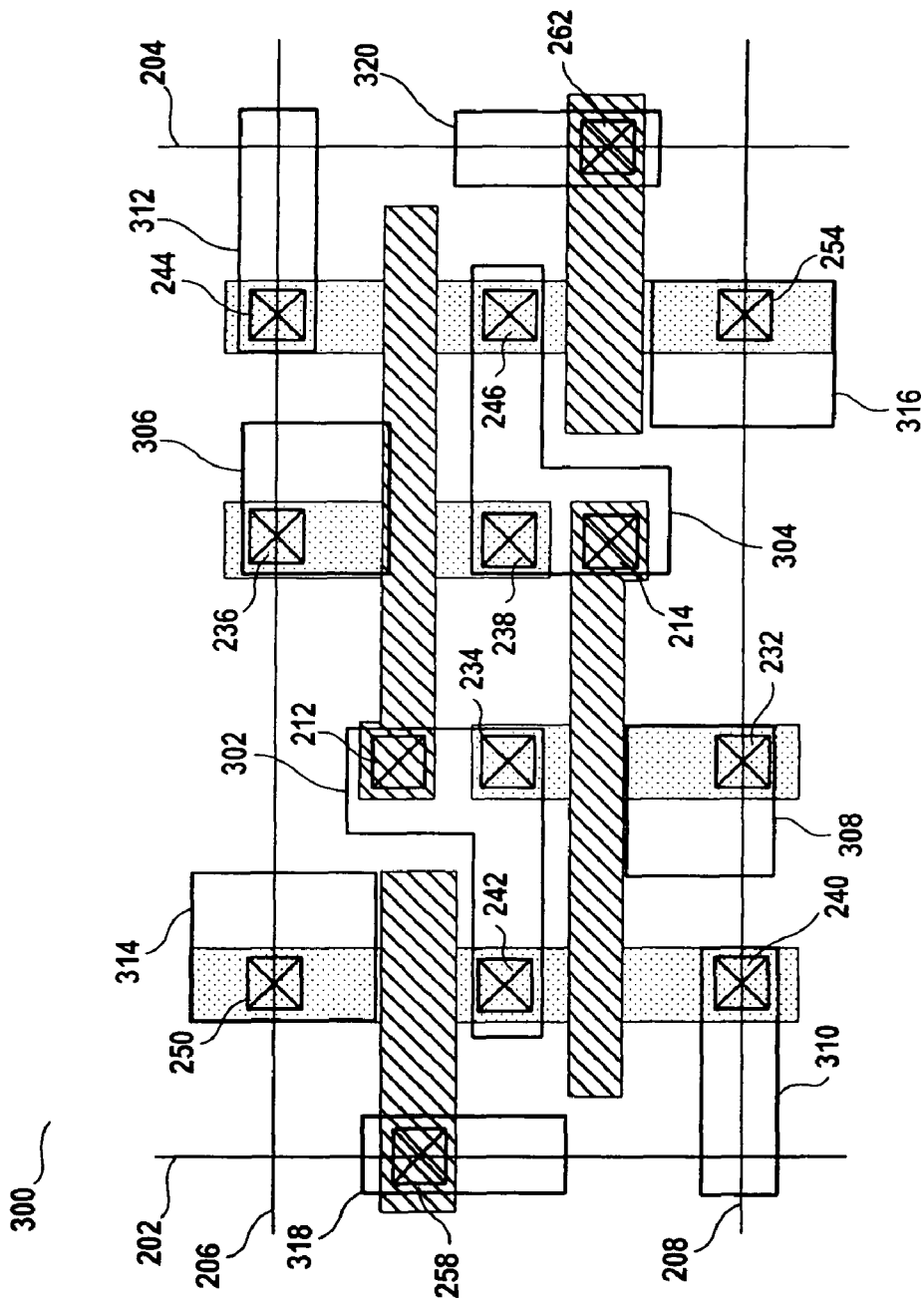
FIG. 3 is an IC layout of a unit memory cell, with the first metal level deposited, in accordance with one embodiment of the present invention.

FIG. 3 is an IC layout 300 of a unit memory cell, with the first metal level deposited, in accordance with one embodiment of the present invention. An L-shaped pad 302 connects the contact 212 to the contacts 234 and 242 to form a storage node SN. An L-shaped pad 304 connects the contact 214 to the contacts 238 and 246 to form a storage node bar SNB. A pad 306 connects to the contact 236. A pad 308 connects to the contact 232. A pad 310 connects to the contact 240. A pad 312 connects to the contact 244. A pad 314 connects to the contact 250. A pad 316 connects to the contact 254. A pad 318 connects to the contact 258. A pad 320 connects to the contact 262

Figure 4B:
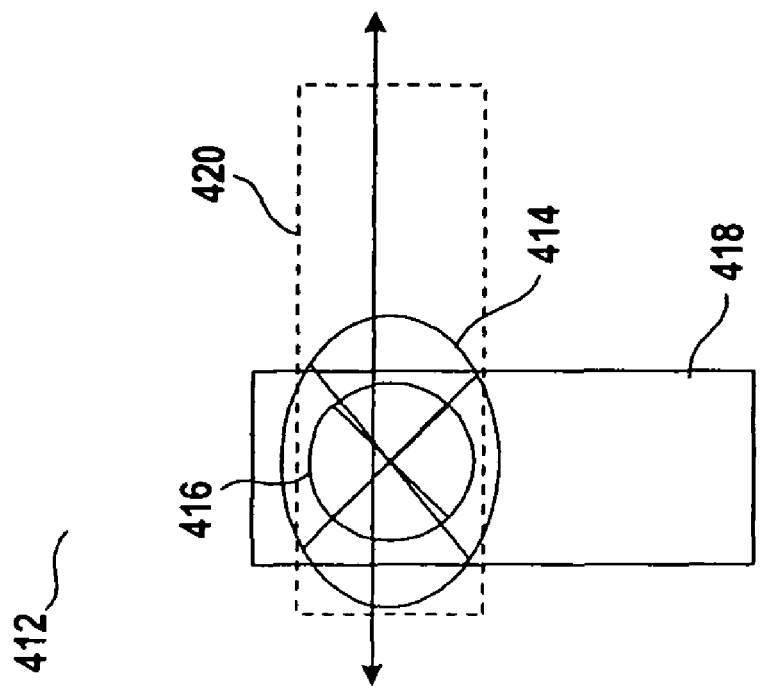
FIG. 4B provides a layout view of an interconnect structure in accordance with one embodiment of the present invention.
Figure 4A:
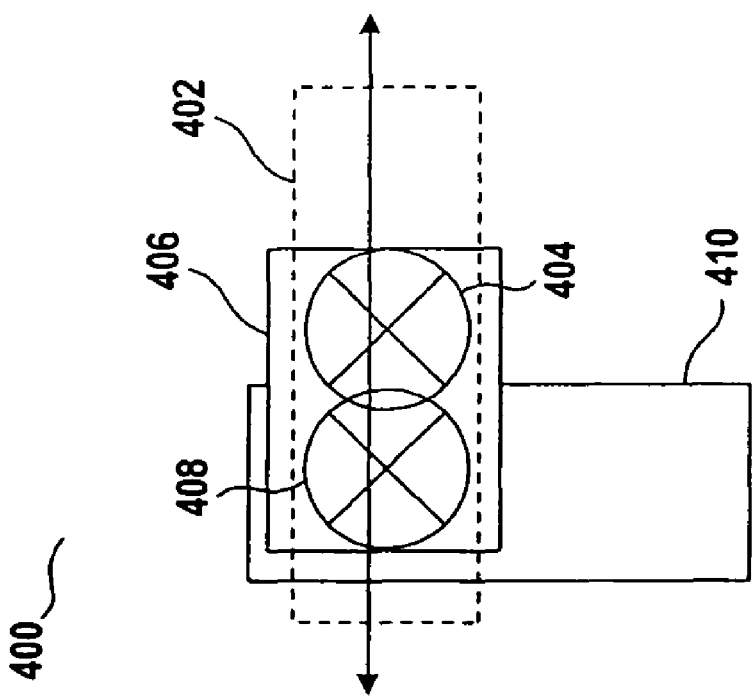
FIG. 4A provides a layout view of a conventional interconnect structure.

FIG. 4A provides a layout 400 of a conventional interconnect structure for an IC. A conductive layer 402 is formed on a first metal level. A contact 404, which is formed by filling a via with conductive materials, is constructed on the first conductive layer 402 and connects to a landing pad 406 on a second metal level. A contact 408, which is formed by filling a via with conductive materials, is constructed on the landing pad 406 and connects to a conductive layer 410 on a third metal level.

As discussed above, the ever-shrinking via contacts pose a great challenge to IC manufacturing due to the limited resolution of the photolithography technology. Conventionally, the landing pad 406 is used for providing the via contacts 404 and 408 with a proper landing margin. However, this complicates the manufacturing of the interconnect structure. Thus, it is desired to have an interconnect structure that does not include a landing pad, without comprising the landing margin for the via contacts 404 and 408.

FIG. 4B illustrates a layout 412 of an interconnect structure in accordance with one embodiment of the present invention. A first conductive layer 420 is formed above a semiconductor substrate, which is not shown in the figure. A first contact 414, which is formed by filling a via with conductive materials, is formed on the first conductive layer 420. A second contact 416, which is formed by filling a via with conductive materials, is formed on the first via contact 414. A second conductive layer 418 is formed on the second via contact 416. In this embodiment, the first via contact 414 has a cross-sectional area substantially larger than that of the second via contact 416. In another embodiment, the cross-sectional area of the first via contact 414 is at least 40% greater than that of the second via contact 416. This improves a landing margin between the first and second via contacts 414 and 416. Thus, the via contacts 414 and 416 can be directly connected with one another without the need of using a landing pad therebetween.

In this embodiment, each of the first and second via contacts 414 and 416 has a sidewall that is substantially uniform along a longitudinal direction thereof. The boundary of the cross-sectional area of the first via contact 414 is large enough to enclose a boundary of the cross-sectional area of the second via contact 416 from a top view perspective. The first and second via contacts 414 and 416 can be made substantially of Cu, TaN, SiC, W or TiN.

It is noted that, while in this embodiment the cross-sectional areas of the via contacts 414 and 416 have an oval and circular shapes, respectively, they can be of other shapes. For example, the cross-sectional areas can be of a rectangular shape, as often used in IC designs by the semiconductor manufacturing industry.

It is noted that, in another embodiment of the invention, the cross-sectional area of the second via contact 416 can be substantially larger than that of the first via contact 414, and it also provides an improved landing margin therebetween.

Figure 5B:
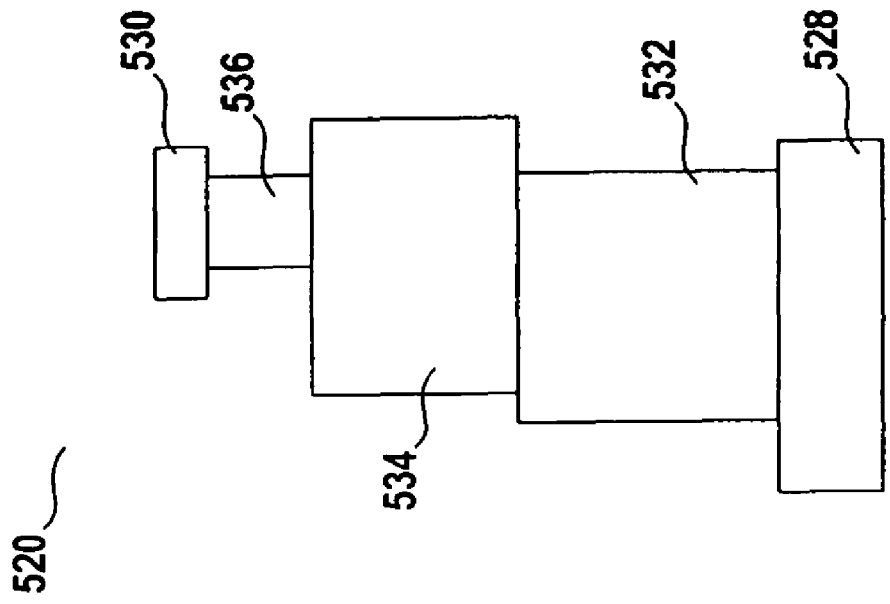
FIGS. 5A and 5B present cross sections of the interconnect structures in accordance with various embodiments of the present invention.
Figure 5A:
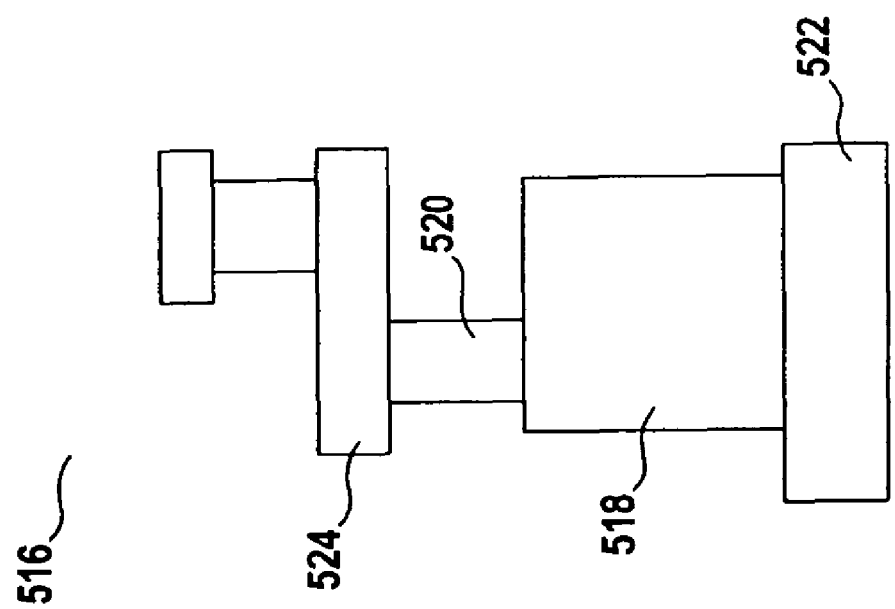

FIGS. 5A and 5B present cross sections 516 and 526 of proposed interconnect structures in accordance with various embodiments of the present invention. FIG. 5A illustrates the cross section 516 of the proposed interconnect structure, wherein the enlarged via contact 518 and the regular-sized via contact 520 are directly connected with one another for electrically connecting the conductive layers 522 and 524.

Referring to FIG. 5B, a first conductive layer 528 is formed on a first metal level. A first via contact 532 formed on the first metal level is directly connected to the first conductive layer 528. A second via contact 536 is directly connected to a second conductive layer 530 on a second metal level. At least one intermediate via contact 534 is connected between the first and second via contacts 536 and 532, on at least one intermediate metal level between the first and second metal levels. One of the first via contact 532, the second via contact 536 and the intermediate via contact 534 has a cross-sectional area substantially larger than that of the other for improving a landing margin, thereby eliminating a need of using a landing pad thereamong.

In this embodiment, the intermediate via contact has a depth extending throughout the intermediate metal level, such that the first metal level of the first conductive layer 528 and the second metal level of the second conductive layer 530 are separated by one or more intermediate metal levels. Each of the first, second, and intermediate via contacts 536, 534 and 532 has a sidewall that is substantially uniform along a longitudinal direction of the same. The first via contact 532 has a cross-sectional area substantially larger than that of the second via contact 536. A boundary of the cross-sectional area of the first via contact 532 is large enough to enclose a boundary of the cross-sectional area of the second via contact 536 from a top view perspective. The intermediate via contact 534 has a cross-sectional area substantially larger than that of the second via contact 536. A boundary of the cross-sectional area of the intermediate via contact 534 is large enough to enclose a boundary of the cross-sectional area of the second via contact 536 from a top view perspective. It is noted that, in another embodiment of the invention, the locations of the second via contact 536 and the first via contact 532 can be switched.

Figure 6:
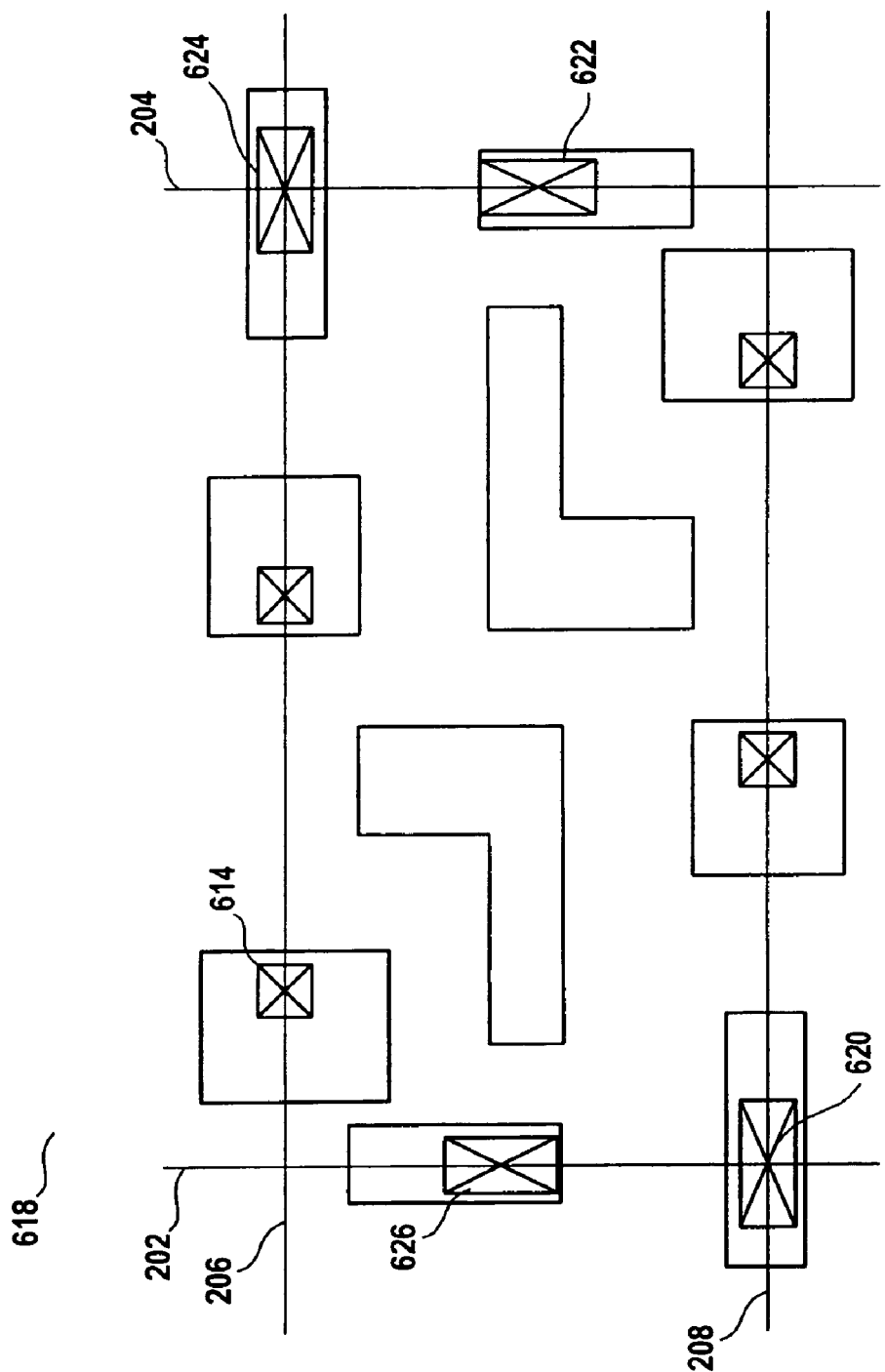
FIG. 6 is an IC layout of a unit memory cell, with the first metal level and the first via level deposited, according to one embodiment of the present invention

FIG. 6 illustrates the application of the present invention to an SRAM memory cell with the first metal level and the first via level deposited. The unit memory cell is outlined by the lines 202, 204, 206, and 208. A metal pattern layout 618 illustrates how the enlarged via contacts 620, 622, 624, and 626 are formed on the first via level according to one embodiment of the present invention.

Figure 7:
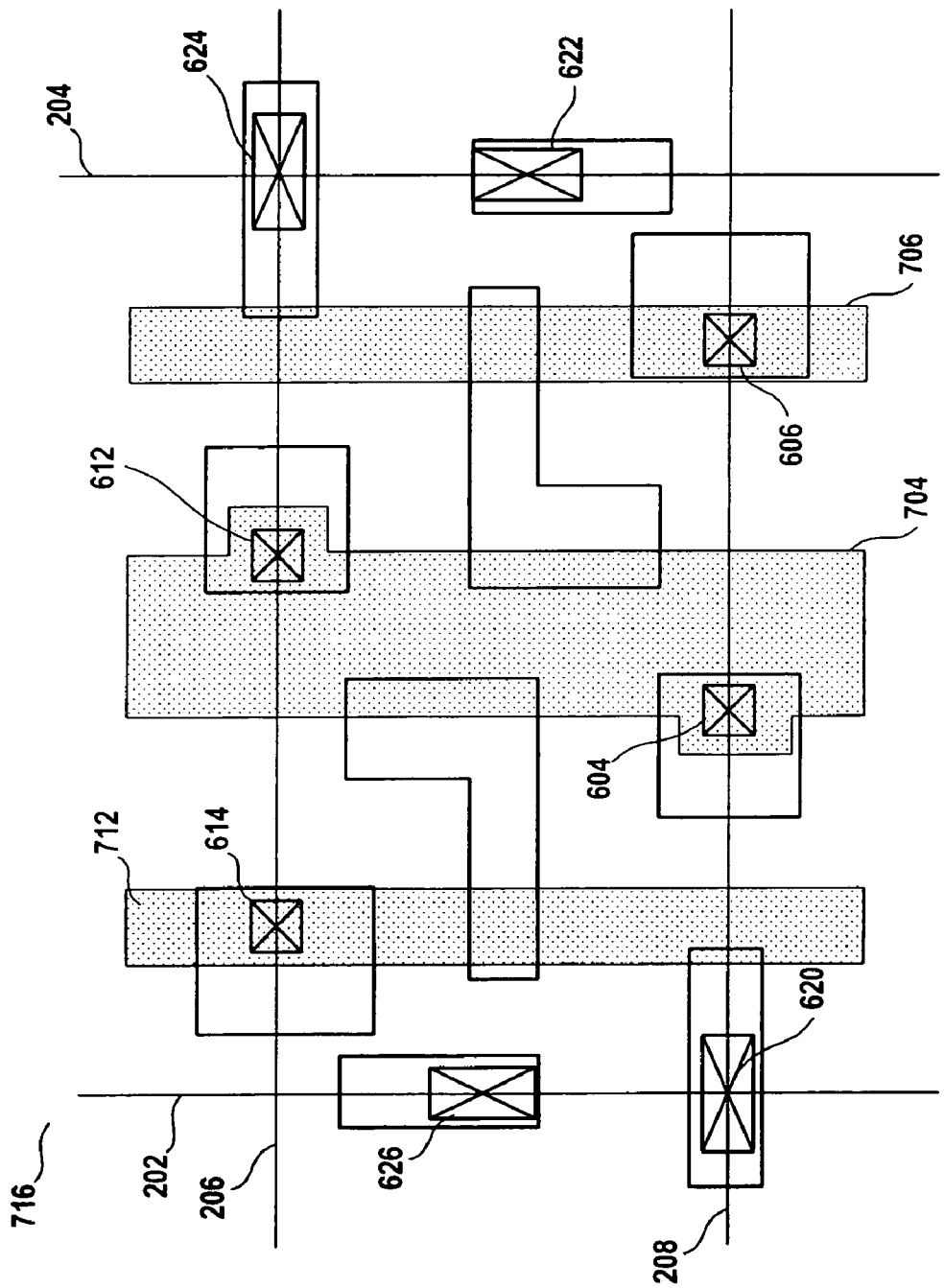
FIG. 7 is an IC layout of a unit memory cell, with the first metal level, the first via level, and the second metal level deposited, according to one embodiment of the present invention.

FIG. 7 illustrates the application of the present invention to an SRAM memory cell with the first metal level, the first via level, and the second metal level added. The unit memory cell is outlined by lines 202, 204, 206, and 208. A metal pattern layout 716 illustrates the enlarged via contacts 620, 622, 624, and 626. The via contacts 604 and 612 are covered by a line 704 on a second metal level. The via contact 606 is covered by a line 706 on a second metal level. The via contact 612 is covered by the line 704. The first via level 614 is covered by the line 712 on the second metal level.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell, comprising:
- a first inverter having a first pull-up transistor and a first pull-down transistor serially coupled between a supply voltage and a complementary supply voltage, respectively;
- a second inverter having a second pull-up transistor and a second pull-down transistor serially coupled between the supply voltage and the complementary supply voltage, respectively,
- wherein a drain of the first pull-down transistor is electrically connected to gates of the second pull-up and pull-down transistors, and a drain of the second pull-down transistor is electrically connected to gates of the first pull-up and pull-down transistors,
- wherein a source of the first pull-down transistor is electrically connected to the complementary voltage by an interconnect structure including a first metal interconnect layer, a first via contact, a second via contact, and a third via contact, wherein the first metal interconnect layer is electrically connected with the source of the first pull-down transistor, the first via contact has a top surface and a bottom surface, the bottom surface of the first via contact being disposed at least partially on the first metal interconnect layer, the second via contact has a top surface and a bottom surface, the bottom surface of the second via contact being disposed at least partially on the top surface of the first via contact, and the third via contact having a top surface and a bottom surface, the bottom surface of the third via contact being disposed at least partially on the top surface of the second via contact; and
- wherein a cross-sectional area of the first via contact is less than a cross-sectional area of the second via contact.

2. The SRAM cell of claim 1 wherein the first and second via contacts are substantially made of Cu, TaN, SiC, W or TiN.

3. The The SRAM cell of claim 1 wherein the first and third via contacts are substantially made of Cu, TaN, SiC, W or TiN.

4. The SRAM cell of claim 1, wherein the second via contact is in direct contact with the first via contact.

5. The SRAM cell of claim 4, wherein the cross-sectional area of the first via contact is greater than a cross-sectional area of the third via contact.

* * * * *